(12) United States Patent　(10) Patent No.: US 7,557,572 B1
Hertz et al.　(45) Date of Patent: Jul. 7, 2009

(54) METHOD OF DETECTING AND COMPENSATING FOR FAULTS IN AN MRI PROCESS

(75) Inventors: David Hertz, Dix Hills, NY (US); Mark E. Hamberger, Bayshore, NY (US); Terry Morrone, Melville, NY (US)

(73) Assignee: Fonar Corporation, Melville, NY (US)

( * ) Notice: Subject to any disclaimer, the term of this patent is extended or adjusted under 35 U.S.C. 154(b) by 168 days.

(21) Appl. No.: 11/612,819

(22) Filed: Dec. 19, 2006

(51) Int. Cl.
　　*G01V 3/00*　(2006.01)
(52) U.S. Cl. .................................... 324/307
(58) Field of Classification Search ................ 324/307
　　See application file for complete search history.

(56) References Cited

U.S. PATENT DOCUMENTS

| | | | | |
|---|---|---|---|---|
| 5,621,321 A | * | 4/1997 | Liu et al. ................... | 324/309 |
| 6,515,476 B1 | * | 2/2003 | Oshio et al. ................. | 324/309 |
| 6,728,568 B1 | * | 4/2004 | Yatsui et al. ................ | 600/410 |
| 7,224,164 B2 | * | 5/2007 | Harvey ...................... | 324/307 |
| 2001/0043068 A1 | * | 11/2001 | Lee ............................. | 324/309 |

* cited by examiner

*Primary Examiner*—Brij B. Shrivastav
*Assistant Examiner*—Megann E Vaughn
(74) *Attorney, Agent, or Firm*—IP Strategies

(57) ABSTRACT

According to a method of detecting and compensating for MRI scan errors, MRI scan data are received. At least one statistical boundaries is determined for the generated data. The data are observed in K-space. The observed K-space data are compared to the determined statistical boundary. Data that are likely undesirable, based on the comparison, are removed. The removed data are replaced with substitute data to modify the data set. Images are generated from the modified data set.

45 Claims, 5 Drawing Sheets

METHOD OF DETECTING AND COMPENSATING FOR FAULTS IN AN MRI PROCESS

FIELD OF THE INVENTION

The present invention relates generally to MRI scanning equipment and processes. More particularly, the present invention relates to processes and devices that provide a more effective way of identifying and compensating for errors and eliminating artifacts in an MRI scanning procedure.

BACKGROUND OF THE INVENTION

Magnetic resonance imaging ("MRI") is one of the most versatile and fastest growing modalities in medical imaging. As part of the MRI process, the subject patient is placed in an external magnetic field. This field is created by a magnet assembly, which can be closed or open. Open magnet assemblies have two spaced-apart magnet poles separated by a gap, and a working magnetic field volume located within the gap.

An MRI scanning procedure requires a coordinated effort among many pieces of hardware and software, and the diagnostic quality of images produced by MRI is directly related to several system performance characteristics. Collection of scan data and production of images from the scan data must be carried out with precision if the resulting images are to have diagnostic value. Glitches in the procedure, due to hardware fatigue, software malfunction, electrical noise, temperature effects, or any other deviation by any operational parameter or outside influence outside of an acceptable tolerance can have a negative effect on the results. For example, temporary EMI may cause the MRI receiver to pick up 'spikes' that have a very broad spectrum, which in turn will have a negative effect on the scan data and images. The MRI image data could suffer from artifacts, such as a degraded signal-to-noise ratio or extraneous lines or grids, sometimes to an extent that the original object is beyond recognition.

It would be advantageous to detect operational parameter deviations and other errors during the course of the scan procedure. However, this isn't always possible, and images often have artifacts or other deficiencies that reduce their diagnostic value, sometimes to the extent that the images are not usable, requiring a new scan.

The term K-space is commonly used with respect to MRI and other NMR applications. When working with MRI data, the observed signals often can be described in a much simpler way in terms of K-space, the linear vector space of n-dimensional complex vectors k based on a Fourier transform of the time-domain data, than using a strictly physical description based on ordinary Euclidean R-space, although distributions in K-space and R-space carry the same information.

After the initial excitation pulse of an MRI pulse sequence, it is possible to depart from the origin of the K-space and move along any desired K-space path using the gradients. Along this path, a record of the Q(k) values can be built for a subset of the visited K-space points. As different paths are collected, the signal becomes the value of a static function Q(k) at a set of visited points. Charting the function Q(k) at a set of points dense enough to makes it possible to carry out, with reasonable precision, the back-transformation into R-space.

As noted above, glitches in an MRI scan procedure due to any number of reasons can have a negative effect on the scan results, and therefore on the image. In such a case, some part of K-space would also be damaged. It would be advantageous to be able to detect and compensate for the errors that cause unusable images, such that these images can be corrected with little or no noticeable degradation in image quality.

BRIEF DESCRIPTION OF THE INVENTION

The invention includes a method of using K-space data to detect whether scan errors have occurred. The related, intolerance K-space data can then be used to provide data to replace the erroneous data. The scan image can then be produced from the reconstructed data.

According to an aspect of the invention, a method of detecting and compensating for MRI scan errors includes receiving MRI scan data. At least one statistical boundary is determined for the generated data. The data are observed in K-space. The observed K-space data are compared to the determined at least one statistical boundary. Data that are likely undesirable, based on the comparison result, are removed. The removed data are replaced with substitute data to modify the data set. Images are generated from the modified data set.

The received MRI scan data can be provided by generating data during performance of an MRI scan. Further, the data can be analyzed by a human operator, for example, an operator controlling an MRI scanning apparatus during a scanning procedure, or someone on a computer to which the data has been ported. In this case, the removed data can be replaced after the scanning procedure has finished. Alternatively, the data can be analyzed by a computer controlling an MRI scanning apparatus during a scanning procedure. In this case, the removed data can be replaced after the scanning procedure has finished, or before the scanning procedure has finished, that is, while the scan is taking place.

The method of the invention can also include determining whether the analyzed data are likely undesirable, based on the comparison.

The at least one statistical boundary can be two-dimensional or, alternatively, three-dimensional.

Determining at least one statistical boundary can include establishing at least one threshold for the data, such as at least one threshold for derivatives of the data. Determining whether the generated data are likely undesirable can include identifying data as undesirable if the data exceeds a predetermined number of thresholds.

Replacing the removed data with substitute data can include, for example, averaging values of adjacent data points or other data corresponding to adjacent data points, or transposing data from a corresponding symmetrically-opposing point in K-space. For example, the entire phase encode level corresponding to the data that are likely to be undesirable can be replaced with adjacent encode levels, sometimes designated as (+1;−1) encode levels, or with a polynomial interpolation of phase encode levels based on data adjacent to the consecutive data points. The polynomial interpolation can be, for example, a linear interpolation.

The at least one statistical boundary can include, for example, values based on object bandwidth, values for slew rate, values for background noise, or any combination of these or other values. The method of the invention can also include performing a first scan, and determining expected scan boundaries based on results of the first scan. The at least one statistical boundary can include a value based on the expected scan boundaries. For example, the first scan can be a T1 scan, and the expected scan boundaries can be T2 boundaries. The first scan data can be any previous scan data, including data retrieved from a database of previous scan data.

Observing the data in K-space can include observing K-space in the time domain. Determining whether the generated data are likely undesirable includes marking as undesirable a phase encode level corresponding to the data that have been determined to be likely undesirable based on observation of K-space in the time domain. A component in time corresponding to the likely undesirable data can also be marked. Alternatively, or in addition, K-space can be observed along a phase encode direction. Determining whether the generated data are likely undesirable can include marking as undesirable data points corresponding to the data determined to be likely undesirable based on observation of K-space along the phase encode direction. Again, a component in time corresponding to the likely undesirable data can also be marked. The data determined to be undesirable based on observation of K-space in the time domain can be compared with data determined to be likely undesirable based on observation of K-space along the phase encode direction, to provide a verified comparison result. In this case, determining whether the generated data are likely undesirable can include making a final determination as to whether the generated data are likely undesirable based on the verified comparison result, and removing data that have been determined to be likely undesirable is based on the final determination.

K-space data can also be observed in the spectral domain, in which case an area of the K-space spectrum can be selected in which only noise is expected. An average data level in the selected area of the K-space spectrum can be compared to a threshold level. The threshold level can correspond, for example, to an expected noise level in the selected area of the K-space spectrum.

DETAILED DESCRIPTION OF THE INVENTION

Valid NMR data have some known statistical boundaries. Therefore, one can analyze the K-space data acquired during a scan and can make a general determination as to whether some of the acquired data are not valid, that is, is likely to produce an image that does not have sufficient diagnostic value according to certain criteria. That is, data that is found to be outside of a predetermined statistical boundary can be deemed invalid and removed from 'K' space and replaced.

There are three modes anticipated for compensating for data that are determined to be undesirable. According to the first mode, image data is acquired. After the scan is complete, a validity analysis is performed, preferably by a skilled operator, and data that are determined to be invalid are removed and replaced.

According to the second mode of operation, a computer process controls the scan procedure and acquires image data. After the scan is complete, a validity analysis is performed by a computer, and data that are determined to be invalid are removed and replaced.

According to the third mode of operation, a computer process controls the scan procedure and acquires image data. As the scan is taking place, a validity analysis is performed by a computer, and data acquisition is repeated for data that are determined to be invalid. The data from the repeated scan are also evaluated, and if it is determined to be valid, replaces the invalid data.

The removed data can then be replaced by data that are determined by averaging the values of adjacent data points. Alternatively, the replacement data can be transposed from the 'other' side of K-space, since K-space is usually symmetrical around (0;0) point. Other methods for selecting replacement data can be used once the invalid data have been identified.

For example, when a nominal MRI scan is performed, the row data are stored. Knowing the scan parameters, one can set the statistical boundaries outside of which the NMR data will be considered invalid. For example, known-invalid ranges for object bandwidth, slew rate, background noise, and other parameters can be set in order to identify data that are most likely invalid.

Figure 1:
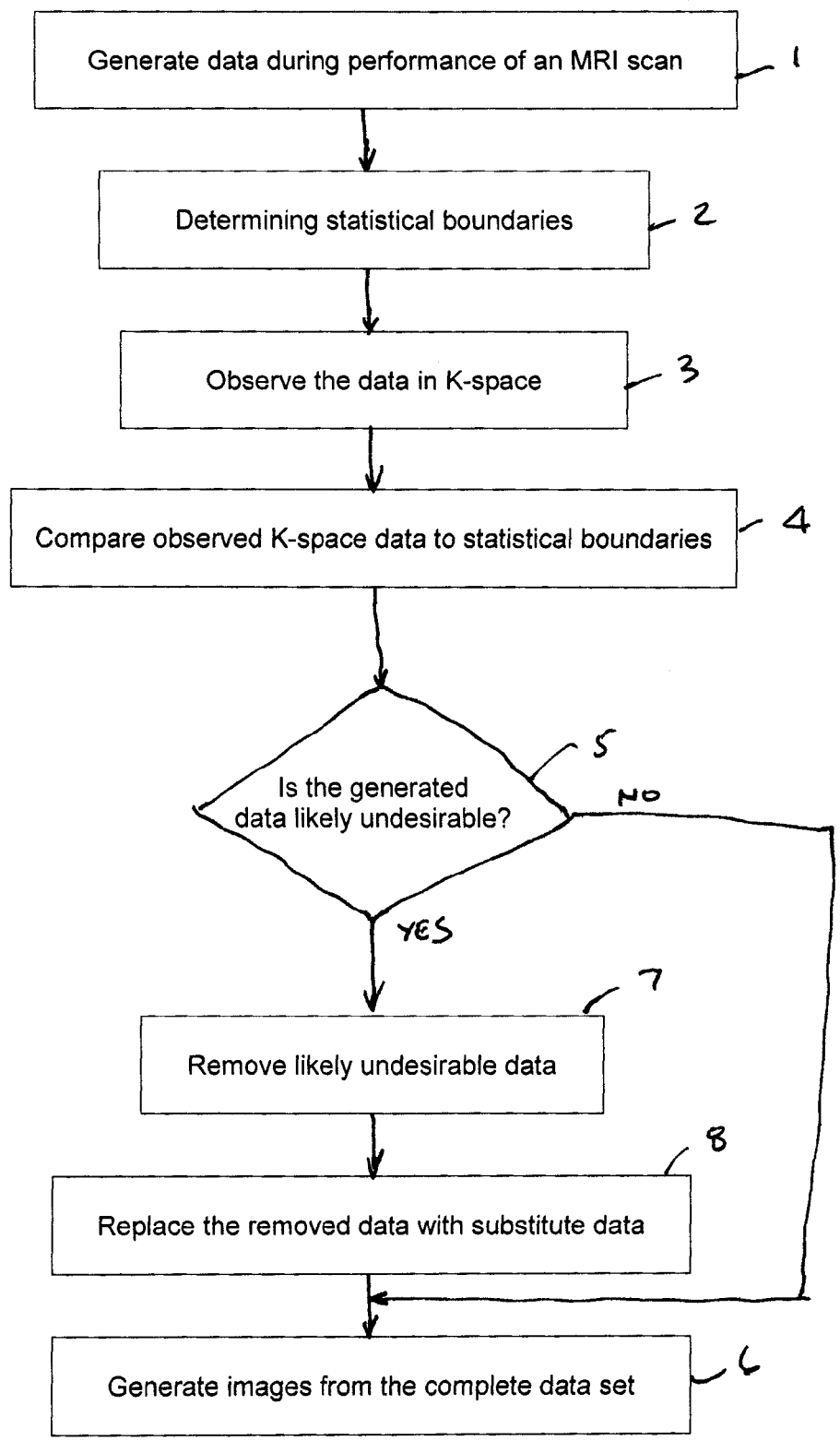
FIG. 1 is a flow diagram showing an exemplary method according to the invention.

FIG. 1 is a flow diagram that shows an exemplary basic process. As shown, data are generated 1 during performance of an MRI scan. Statistical boundaries, which can be two-dimensional or three-dimensional, are determined 2 according to data and imaging quality criteria. The data are then observed 3 in K-space and compared 4 to the statistical boundaries. Based on this comparison, it is determined 5 whether the data are likely undesirable. If not, the data are used as part of the complete data set from which images will be generated 6. If the generated data are determined to be likely undesirable, this data are removed 7. The removed data are then replaced 8 with substitute data, which are then used as part of the modified data set from which images will be generated 6.

An exemplary statistical boundary can be based on the expected noise level that is experienced and measured during a scan. For the size of a given imaging object, and expected NMR signal bandwidth for that object can be determined. If the noise level measured during the actual scan varies form the expected noise level by more than a predetermined variance, the acquired data associated with that unexpected noise measurement can be deemed to be undesirable and likely invalid. The expected object bandwidth and slew rate can also provide values on which the statistical boundary can be based. In addition, results of a previous scan can be used to determine expected boundaries for a later scan. These expected boundaries can be used as the basis for a statistical boundary to be used in making the K-space data comparison. For example, previous T1 scan data can provide expected boundaries for a later T2 scan. These expected T2 boundaries can be used as the basis for a statistical boundary to be used in making the K-space data comparison.

The K-space can be observed in the time domain to detect derivatives that exceed a threshold level. When the threshold is exceeded, that phase encode level is marked as invalid, and the component in time at which the event occurred is also marked. The K-space can also be observed along the phase encode direction. Using a similar derivative threshold method, the data points that exceed the threshold level can be marked as invalid. The results of the time domain observation and the phase encode observation can be compared to verify the determination.

The data can also be observed in the spectral domain (first pass) by selecting an area of the spectrum in which only noise, and no object data, is expected. The average intensity in this portion of the spectrum is compared to an expected noise level that is used as a threshold. Disturbances caused by a spike or other amplitude variation, or by an indication that the NMR sequence is out of synch, will result in a wideband spectrum that will elevate the noise area of the NMR spectrum, indicating a likelihood of invalid data.

Data that were detected and determined to be invalid are taken out and replaced, for example by data corresponding to adjacent data points. That is, the entire phase encode level can be removed and replace by adjacent encode levels, or some variation, if those are not determined to be invalid. If the adjacent levels are also determined to be invalid, other data are substituted to fill in the invalid data points. For example, a linear interpolation of further phase encode levels can be generated as substitute data. Because phase encode data are symmetrical around phase encode zero, reliable data should be available to substitute for invalid data if the scan results in a reasonably high percentage of valid data.

For a higher level of correction, particularly for a single data point, such as in a case in which spikes are very narrow in time, the average of the time domain point for the data can be used as the substitute data.

As a validation process, acquired data can also be compared to symmetrically-opposing data on the "negative" side of K-space. Data that are likely undesirable should show a marked difference from its "negative" valid counterpart.

The processes described above can also be used in connection with signal averaging scan techniques, by which the results of two or more data acquisitions taken under similar conditions are averaged to suppress the effects of random variations or random artifacts, thereby increasing the signal-to-noise ratio (SNR). The number of averaged number of excitations (NEX), provides an approximate amount of improvement in SNR according to the square root of the number of excitations. If the scan data being evaluated are part of a NEX scan procedure, data acquired as a result of each excitation can be stored, and data that are likely undesirable can be replaced by corresponding data from a different excitation. The likely undesirable data can also be validated by comparing the degree of variation of that data against data collected in the corresponding scans.

Figure 2:
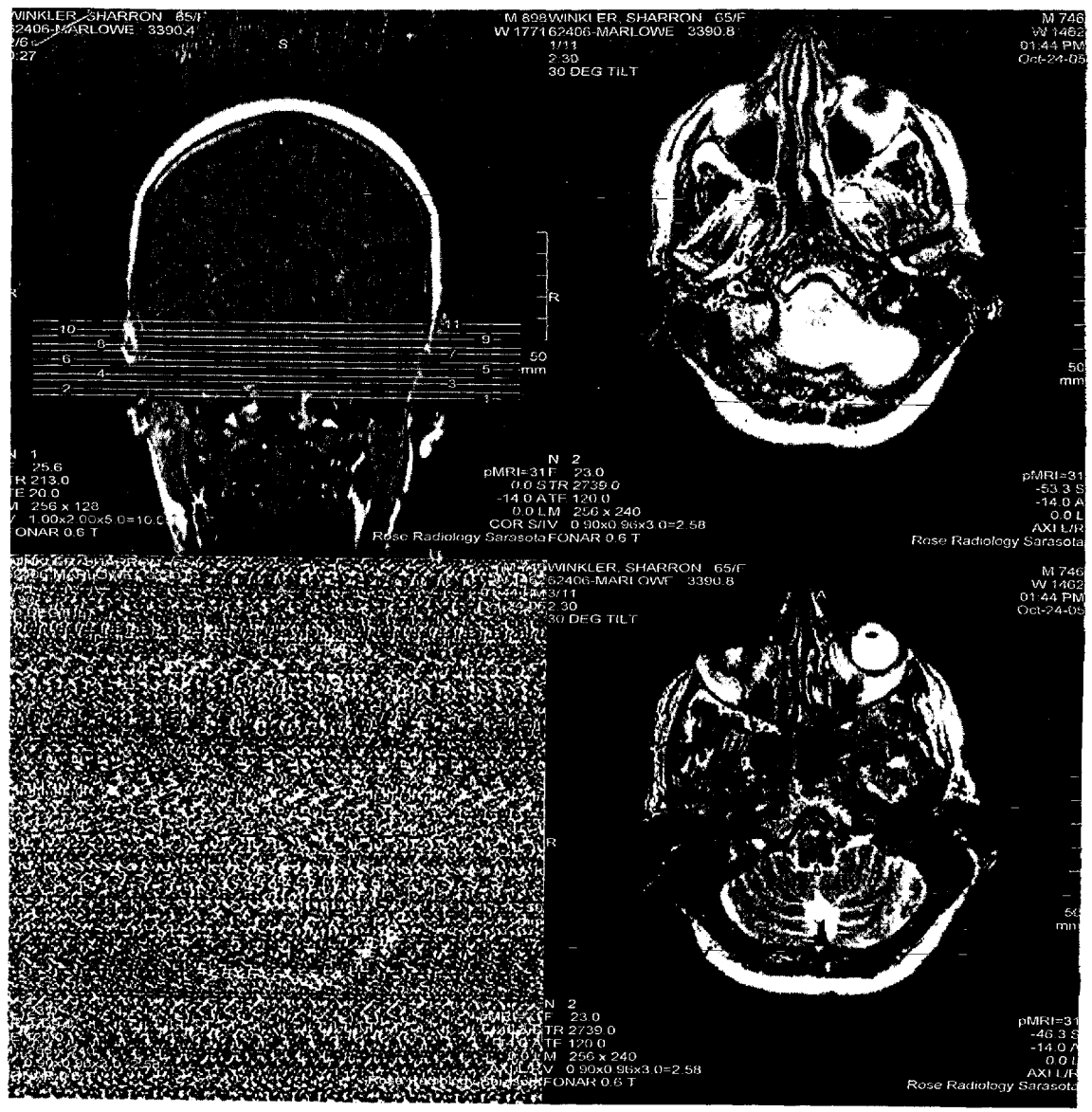
FIG. 2 shows images produced by scan data prior to compensation by the method of the invention.
Figure 3:
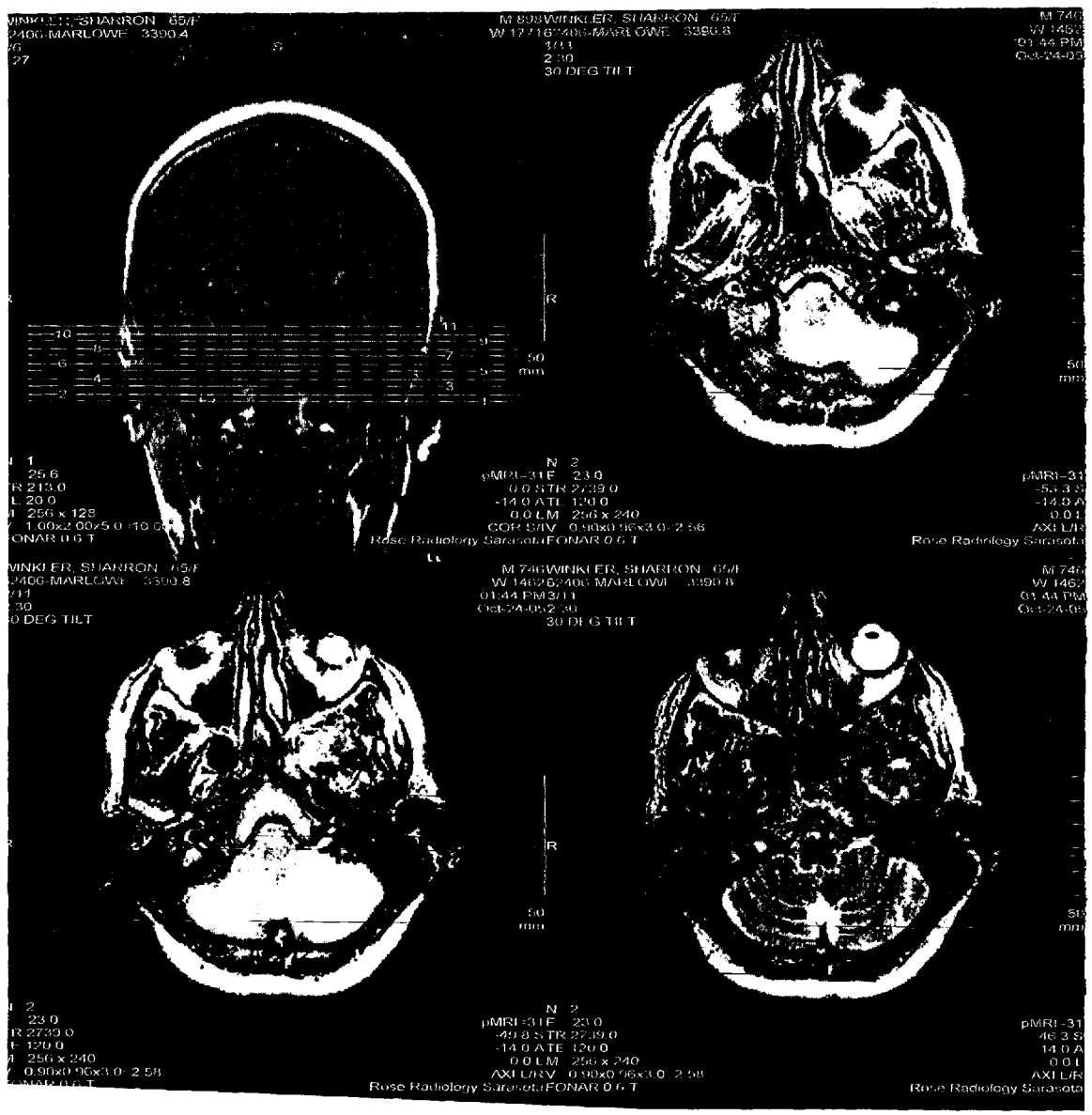
FIG. 3 shows images produced by the scan data of FIG. 2 after compensation by the method of the invention.
Figure 4:
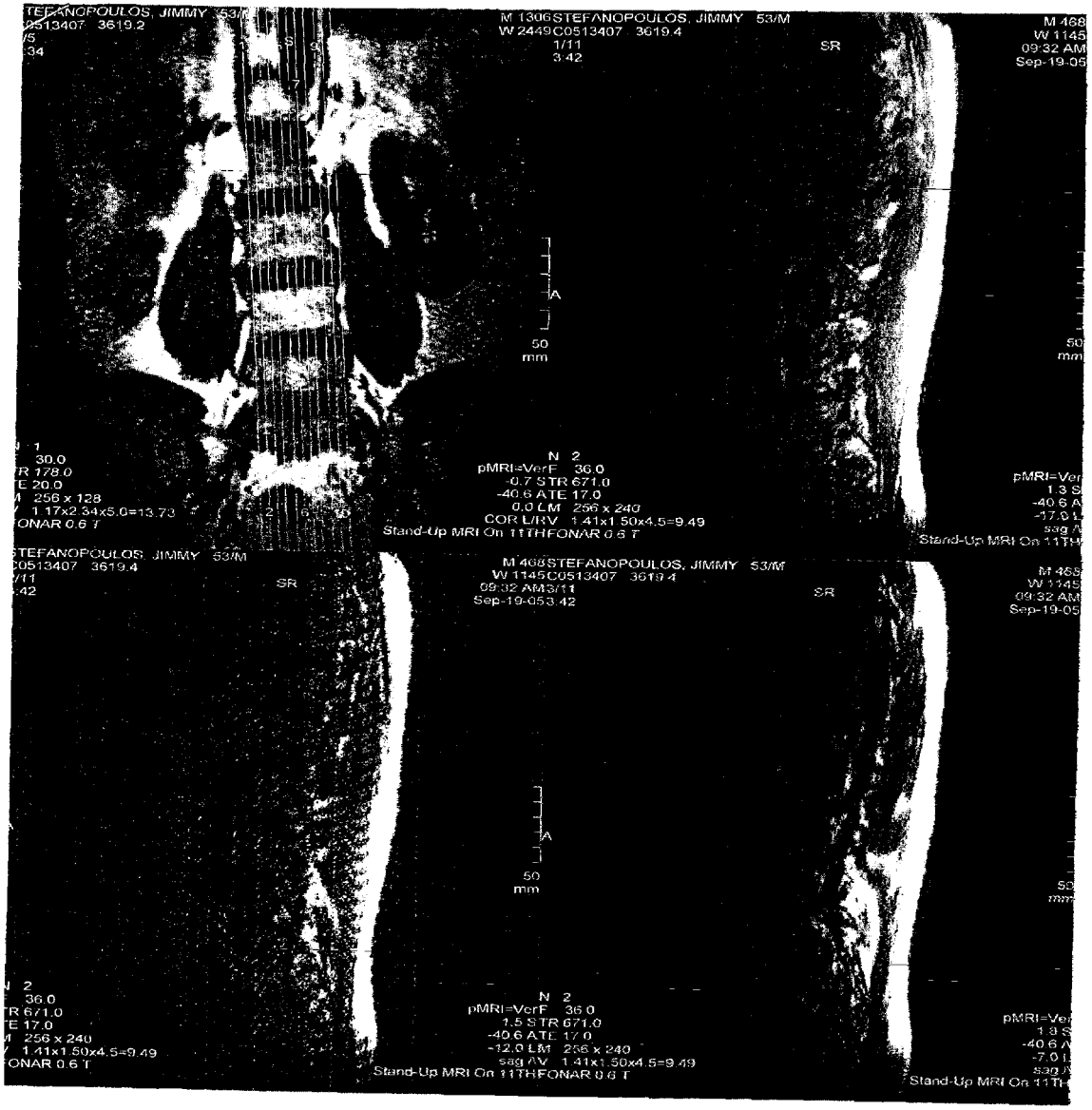
FIG. 4 shows images produced by scan data prior to compensation by the method of the invention.
Figure 5:
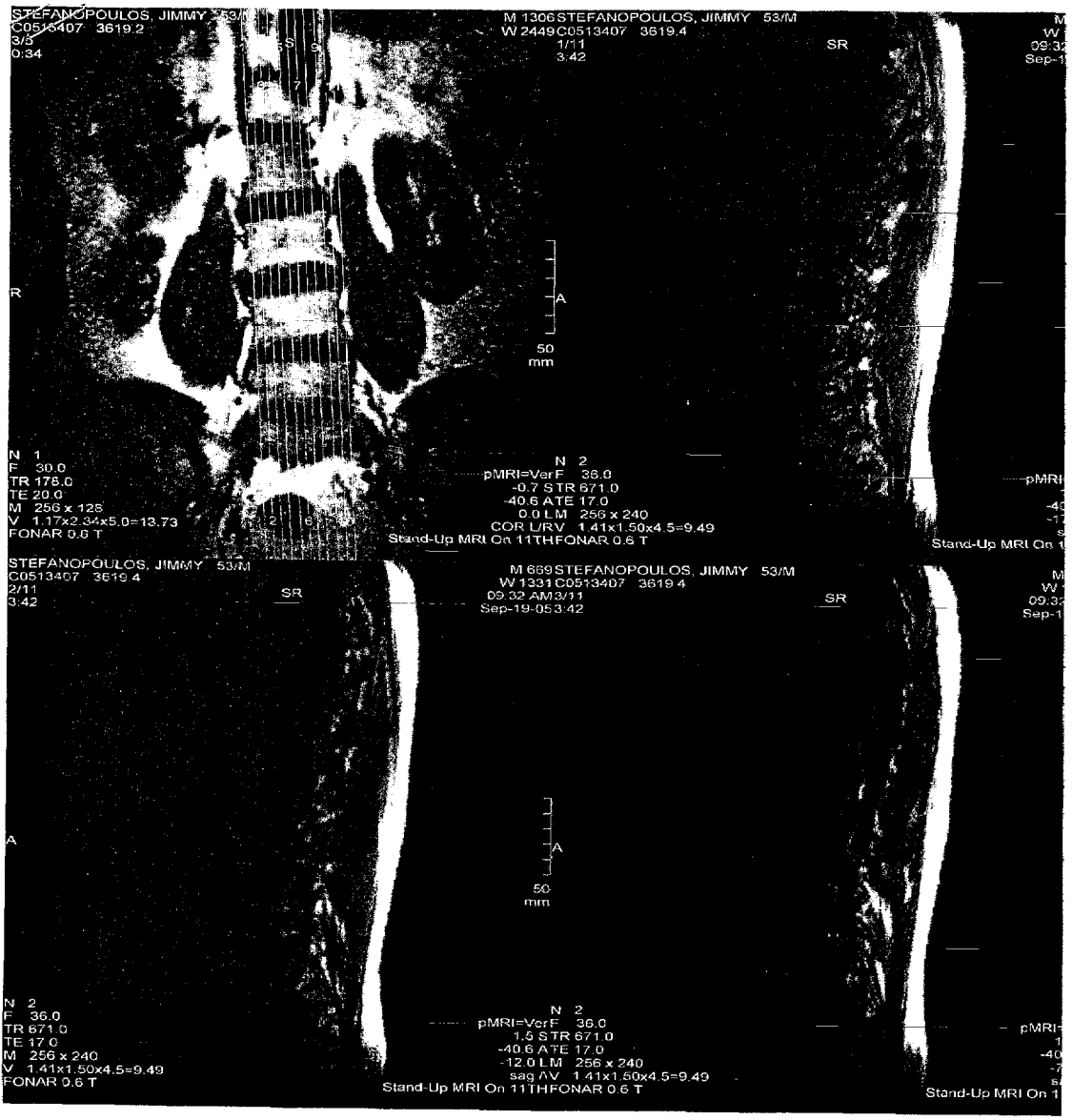
FIG. 5 shows images produced by the scan data of FIG. 2 after compensation by the method of the invention.

FIGS. 2 and 4 show images generated from scan data acquired during clinical scans, prior to compensation according to the described method. As shown, some images based on the original data were beyond recognition, while others were significantly degraded. From the original data, invalid data were identified, removed, and replaced; that data set was reconstructed, and new images were generated based on the reconstructed data. As shown in FIGS. 3 and 5, no noticeable residual artifacts can be detected.

Particular exemplary embodiments of the present invention have been described in detail. These exemplary embodiments are illustrative of the inventive concept recited in the appended claims, and are not limiting of the scope or spirit of the present invention as contemplated by the inventors.

We claim:

1. A method of detecting and compensating for MRI scan errors, comprising:
   receiving MRI scan data;
   determining at least one statistical boundary for the generated data;
   observing the data in K-space;
   comparing the observed K-space data to the determined at least one statistical boundary;
   removing data that are likely undesirable, based on the comparison result;
   replacing the removed data with substitute data to modify the data set; and
   generating images from the modified data set;
   wherein the removed data are replaced after the scanning procedure has finished.

2. The method of claim 1, further comprising generating data during performance of an MRI scan to provide the received MRI scan data.

3. The method of claim 1, wherein the data are analyzed by a human operator after a scanning procedure.

4. The method of claim 1, further comprising determining whether the generated data are likely undesirable, based on the comparison.

5. The method of claim 1, wherein the at least one statistical boundary is two-dimensional.

6. The method of claim 1, wherein the at least one statistical boundary is three-dimensional.

7. The method of claim 1, wherein determining the at least one statistical boundary includes establishing at least one threshold for the data.

8. The method of claim 7, wherein establishing at least one threshold for the data includes establishing at least one threshold for derivatives of the data.

9. The method of claim 7, wherein determining whether the generated data are likely undesirable includes identifying data as undesirable if the data exceed a predetermined number of the at least one threshold.

10. The method of claim 1, wherein the at least one statistical boundary includes a value based on object bandwidth.

11. The method of claim 1, wherein the at least one statistical boundary includes a value based on slew rate.

12. A method of detecting and compensating for MRI scan errors, comprising:
    receiving MRI scan data;
    determining at least one statistical boundary for the generated data;
    observing the data in K-space;
    comparing the observed K-space data to the determined at least one statistical boundary;
    removing data that are likely undesirable, based on the comparison result;
    replacing the removed data with substitute data to modify the data set; and
    generating images from the modified data set;
    wherein the removed data are replaced before the scanning procedure has finished.

13. The method of claim 12,
    further comprising generating data during performance of an MRI scan to provide the received MRI scan data,
    wherein the data are analyzed by a computer controlling an MRI scanning apparatus during a scanning procedure.

14. The method of claim 12, further comprising determining whether the generated data are likely undesirable, based on the comparison.

15. The method of claim 12, wherein the at least one statistical boundary is two-dimensional.

16. The method of claim 12, wherein the at least one statistical boundary is three-dimensional.

17. The method of claim 12, wherein determining the at least one statistical boundary includes establishing at least one threshold for the data.

18. The method of claim 17, wherein establishing at least one threshold for the data includes establishing at least one threshold for derivatives of the data.

19. The method of claim 17, wherein determining whether the generated data are likely undesirable includes identifying data as undesirable if the data exceed a predetermined number of the at least one threshold.

20. The method of claim 12, wherein the at least one statistical boundary includes a value based on object bandwidth.

21. The method of claim 12, wherein the at least one statistical boundary includes a value based on slew rate.

22. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set; and
generating images from the modified data set;
wherein replacing the removed data with substitute data includes averaging values of adjacent data points.

23. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable based on the comparison result;
replacing the removed data with substitute data to modify the data set; and
generating images from the modified data set;
wherein replacing the removed data with substitute data includes transposing data from a corresponding symmetrically-opposing point in K-space.

24. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set; and
generating images from the modified data set;
wherein the substitute data includes data corresponding to adjacent data points.

25. The method of claim 24, wherein replacing the removed data with substitute data includes replacing the entire phase encode level corresponding to the data that are likely to be undesirable with adjacent encode levels.

26. The method of claim 24, wherein replacing the removed data with substitute data includes replacing phase encode levels corresponding to consecutive data points that are likely to be undesirable with a polynomial interpolation of phase encode levels based on data adjacent to the consecutive data points.

27. The method of claim 26, wherein the polynomial interpolation is a linear interpolation.

28. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set; and
generating images from the modified data set;
wherein the at least one statistical boundary includes a value based on background noise.

29. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set;
generating images from the modified data set;
performing a first scan; and
determining expected scan boundaries for a later based on results of the first scan;
wherein the at least one statistical boundary includes a value based on the expected scan boundaries.

30. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set;
generating images from the modified data set;
performing a first scan; and
determining expected scan boundaries for a later based on results of the first scan;
wherein the first scan is a T1 scan, and the expected scan boundaries are T2 scan boundaries.

31. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set; and
generating images from the modified data set;
wherein observing the data in K-space includes observing K-space in the time domain; and
wherein determining whether the generated data are likely undesirable includes marking as undesirable a phase encode level corresponding to the data that have been determined to be likely undesirable based on observation of K-space in the time domain.

32. The method of claim 31, further comprising marking a component in time corresponding to the likely undesirable data.

33. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set; and
generating images from the modified data set;
wherein observing the data in K-space includes observing K-space in the time domain; and
further comprising observing K-space along a phase encode direction.

34. The method of claim 33, wherein determining whether the generated data are likely undesirable includes marking as undesirable data points corresponding to the data determined to be likely undesirable based on observation of K-space along the phase encode direction.

35. The method of claim 34, further comprising marking a component in time corresponding to the likely undesirable data.

36. The method of claim 33, further comprising comparing data determined to be undesirable based on observation of K-space in the time domain with data determined to be likely undesirable based on observation of K-space along the phase encode direction, to provide a verified comparison result.

37. The method of claim 36, wherein determining whether the generated data are likely undesirable includes making a final determination as to whether the generated data are likely undesirable based on the verified comparison result.

38. The method of claim 37, wherein removing data that have been determined to be likely undesirable is based on the final determination.

39. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set;
generating images from the modified data set; and
observing K-space along a phase encode direction.

40. The method of claim 39, wherein determining whether the generated data are likely undesirable includes marking as undesirable data points corresponding to the data determined to be likely undesirable based on observation of K-space along the phase encode direction.

41. The method of claim 40, further comprising marking a component in time corresponding to the likely undesirable data.

42. A method of detecting and compensating for MRI scan errors, comprising:
receiving MRI scan data;
determining at least one statistical boundary for the generated data;
observing the data in K-space;
comparing the observed K-space data to the determined at least one statistical boundary;
removing data that are likely undesirable, based on the comparison result;
replacing the removed data with substitute data to modify the data set;
generating images from the modified data set; and
observing the K-space data in the spectral domain;
wherein observing the K-space data in the spectral domain includes selecting an area of the K-space spectrum in which only noise is expected.

43. The method of claim 42, further comprising comparing an average data level in the selected area of the K-space spectrum to a threshold level.

44. The method of claim 43, wherein the threshold level corresponds to an expected noise level in the selected area of the K-space spectrum.

45. The method of claim 43, wherein the threshold level is an expected noise level in the selected area of the K-space spectrum.

* * * * *